(12) United States Patent
Singer et al.

(10) Patent No.: US 7,821,296 B2
(45) Date of Patent: Oct. 26, 2010

(54) STACKED BUFFERS

(75) Inventors: Lawrence A. Singer, Burlington, MA (US); Ronald A. Kapusta, Jr., Waltham, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/498,994

(22) Filed: Aug. 4, 2006

(65) Prior Publication Data
US 2008/0030233 A1    Feb. 7, 2008

(51) Int. Cl.
*H03K 19/094* (2006.01)
(52) U.S. Cl. .............................. 326/83; 326/81; 326/86; 327/53; 327/541
(58) Field of Classification Search ............. 326/81–83, 326/86–87; 327/108–109, 112, 53, 132, 327/541, 543; 330/254–255, 261, 264–265, 330/267–268, 270–274; 323/315, 316
See application file for complete search history.

(56) References Cited

U.S. PATENT DOCUMENTS

| | | | |
|---|---|---|---|
| 4,728,903 A * | 3/1988 | Reiffin | 330/264 |
| 5,323,158 A | 6/1994 | Ferguson, Jr. | |
| 5,479,130 A * | 12/1995 | McCartney | 327/341 |
| 5,742,183 A * | 4/1998 | Kuroda | 326/81 |
| 5,838,191 A * | 11/1998 | Opris et al. | 327/539 |
| 5,926,049 A * | 7/1999 | Shi | 327/170 |
| 6,040,793 A | 3/2000 | Ferguson, Jr. et al. | |
| 6,388,499 B1 * | 5/2002 | Tien et al. | 327/333 |
| 6,567,441 B2 * | 5/2003 | Furudate et al. | 372/38.02 |
| 6,768,369 B1 * | 7/2004 | Dunn et al. | 327/534 |
| 7,002,401 B2 * | 2/2006 | Khalid | 327/541 |
| 7,026,802 B2 * | 4/2006 | Gradinariu | 323/316 |
| 7,329,968 B2 * | 2/2008 | Shepard et al. | 307/18 |
| 2002/0074948 A1 | 6/2002 | Aso | |
| 2004/0150464 A1 | 8/2004 | Khalid | |
| 2007/0040580 A1 | 2/2007 | Zanchi et al. | |

* cited by examiner

*Primary Examiner*—James H. Cho
*Assistant Examiner*—Christopher Lo
(74) *Attorney, Agent, or Firm*—Kenyon & Kenyon LLP

(57) ABSTRACT

Two or more buffers may configured and arranged such that a quiescent current that flows through and biases a first buffer also flows through and biases a second buffer. The first and second buffers may, for example, be source followers used as reference buffers that drive inputs of a switched-capacitor circuit.

24 Claims, 2 Drawing Sheets

STACKED BUFFERS

BACKGROUND

Source followers and emitter followers are very well known buffer topologies. Examples of p-type metal oxide semiconductor (PMOS) and n-type metal oxide semiconductor (NMOS) source followers are shown, respectively, in FIGS. 1A and 1B. In each case, a current source 102 is used to generate a bias current for a transistor 104, 106 coupled between an input node 108 and an output node 110. As is well understood in the art, when the transistors 104, 106 are properly biased, each will regulate current flow between its drain and source so as to maintain a gate-to-source voltage that is substantially constant. Thus, in the example of FIG. 1A, a voltage $V_{OUT}$ at the output node 110 is maintained at a substantially-constant gate-to-source voltage drop ($V_{GS}$) below a voltage $V_{IN}$ at the input node 108, regardless of certain changes in the impedance of the load connected to the output node 110. Similarly, in the example of FIG. 1B, the voltage VOUT at the output note 110 is maintained at a substantially-constant gate-to-source voltage drop ($V_{GS}$) above the voltage $V_{IN}$ at the input node 108, regardless of certain changes in the impedance of the load connected to the output node 110. While there are certainly many more complicated buffer topologies, these followers tend to be the simplest and also some of the most power and noise efficient.

SUMMARY OF THE INVENTION

According to one aspect of the present invention, a circuit comprises first and second buffers configured and arranged such that a quiescent current that flows through and biases the first buffer also flows through and biases the second buffer.

According to another aspect, a method involves causing a quiescent current that flows through and biases a first buffer to also flow through and bias a second buffer.

According to another aspect, a circuit comprises first and second buffers, and means for determining a value of a quiescent current that flows through and biases both the first buffer and the second buffer.

DETAILED DESCRIPTION

There are many applications where multiple buffers are required. We have recognized that an advantage may be achieved, in terms of power, by stacking two or more buffers between the high and low supplies. By using the same quiescent current to bias all of the buffers in the stack, rather than requiring a separate bias current for each distinct buffer, the total power dissipated by the circuit can be reduced significantly.

Although the examples provided herein are of stacked source followers in a complementary metal oxide semiconductor (CMOS) topology, it should be appreciated that any of a number of different types of buffers employing various other topologies may alternatively be employed, and that the invention is not limited to the particular types of buffers described. For instance, the circuits below, or certain portions thereof, may additionally or alternatively be implemented as emitter followers in a bipolar topology.

Figure 2:
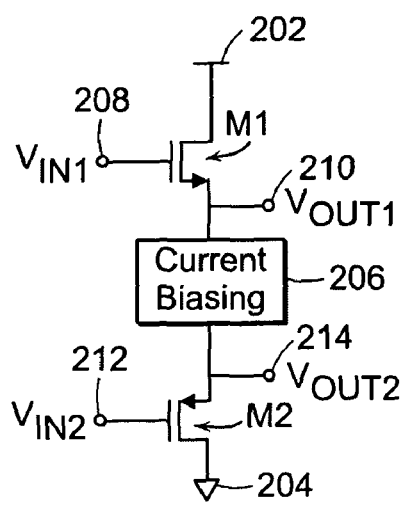
FIG. 2 is a partial-schematic, partial-block diagram of an example of a stacked buffer circuit embodying certain aspects of the invention.

FIG. 2 is a partial-schematic, partial-block diagram of an example of a stacked buffer circuit embodying certain aspects of the invention. As shown, the circuit comprises an NMOS transistor M1 and a PMOS transistor M2 stacked in between a high supply node 202 (for example, $V_{DD}$) and a low supply node 204 (for example, GND). In this example, connected between the sources of the NMOS and PMOS transistors M1, M2 is a current biasing element 206, which functions to determine the quiescent current flowing through the two transistors M1, M2. As explained in more detail below, the current biasing element 206 can take on any of numerous forms and can be disposed in any of numerous locations with respect to the buffers, and the invention is not limited to the use of any particular type of device or circuit for this purpose. All that is important is that the current biasing element be capable of determining the quiescent current that flows through and between the buffer transistors M1, M2 to a level of accuracy that is suitable for the application at hand. In some embodiments, one of the loads of the circuit (not shown in FIG. 2) can even serve as the current biasing element for the buffers. Although several examples of suitable current biasing elements are discussed below, it should be appreciated that the invention is not limited to the use of the particular current biasing circuits and techniques that are described.

Figure 1A:
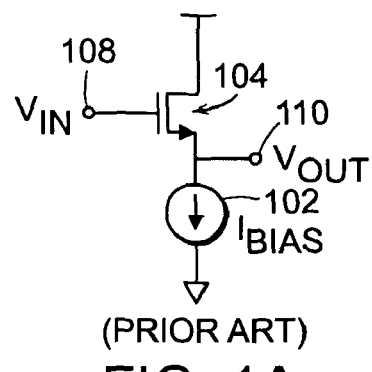
FIG. 1A is schematic diagram of a prior art NMOS source follower circuit.
Figure 1B:
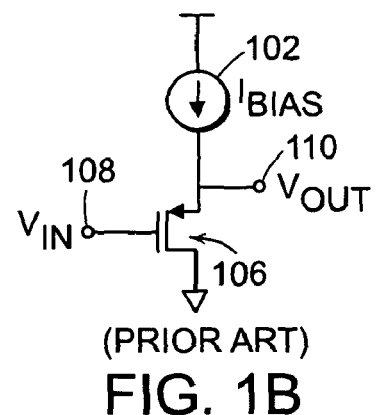
FIG. 1B is schematic diagram of a prior art PMOS source follower circuit.

The respective source-follower buffers in the circuit of FIG. 2 may operate much like the prior art, individual source follower buffers described above in connection with FIGS. 1A and 1B. In particular, the transistor M1 may regulate current flow between its drain and source so that a voltage $V_{OUT1}$ at a first output node 210 (connected to the source of the NMOS transistor M1) is maintained at a substantially-constant gate-to-source voltage drop ($V_{GS}$) below a voltage $V_{IN1}$ at a first input node 208 (connected to the gate of the NMOS transistor M1), regardless of certain changes in the impedance of the load connected to the first output node 210. Likewise, the transistor M2 may regulate current flow between its drain and source so that a voltage $V_{OUT2}$ at a second output node 214 (connected to the source of the PMOS transistor M2) is maintained at a substantially-constant gate-to-source voltage drop ($V_{GS}$) above a voltage $V_{IN2}$ at a second input node 212 (connected to the gate of the PMOS transistor M2), regardless of certain changes in the impedance of the load connected to the second output node 214.

Figure 3:
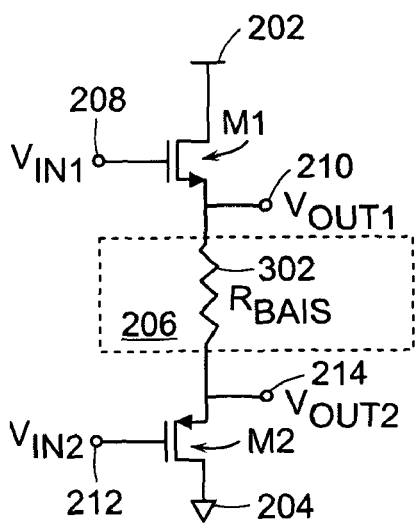
FIG. 3 is a schematic diagram showing one illustrative embodiment of the circuit shown in FIG. 2.

FIG. 3 is a schematic diagram of an example embodiment of a stacked buffer circuit like that shown in FIG. 2, wherein the current biasing element 206 comprises a resistor 302 that introduces a resistance $R_{BIAS}$ between the sources of the NMOS and PMOS transistors M1, M2. If the voltages at the first and second output nodes 210, 214 are known, then the resistance $R_{BIAS}$ can be chosen to determine the quiescent current, $I_{BIAS}$, shown below in Equation (1).

$$I_{BIAS} = \frac{(V_{OUT1} - V_{OUT2})}{R_{BIAS}} \quad (1)$$

Although the resistor-based current biasing technique employed in the FIG. 3 embodiment may be functional for some applications, it may not be the best option in circumstances where the voltages $V_{OUT1}$, $V_{OUT2}$ at the output nodes 210, 214 are expected to undergo significant changes during operation. This is because the quiescent current $I_{BIAS}$ may vary significantly as the voltages $V_{OUT1}$, $V_{OUT2}$ at the output nodes 210, 214 change, and the resistor 302 may also introduce a path for crosstalk between the two output nodes 210, 214.

Figure 4:
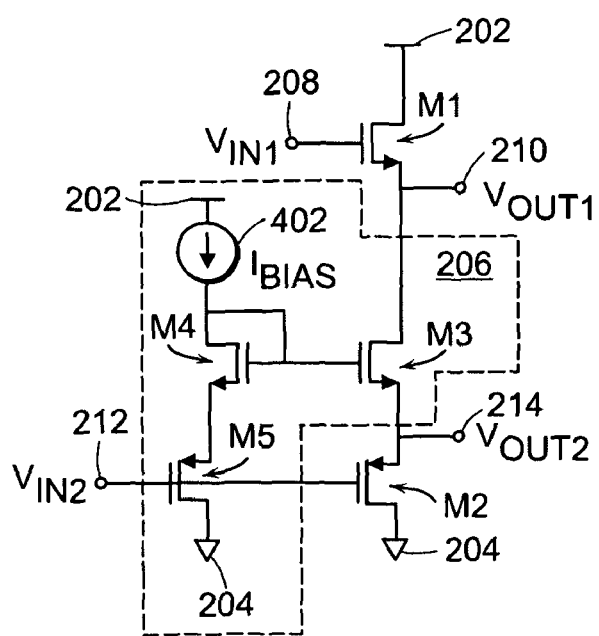
FIG. 4 is a schematic diagram showing another illustrative embodiment of the circuit shown in FIG. 2.

FIG. 4 is a schematic diagram of another example embodiment of a stacked buffer circuit like that shown in FIG. 2, wherein the current biasing element 206 is more complex and more robust. As shown, in this example, the current biasing element 206 comprises a current source 402, a pair of NMOS transistors M3, M4, and a PMOS transistor M5. The drain and source of the NMOS transistor M3 are connected, respectively, to the source of the NMOS transistor M1 and the source of the PMOS transistor M2. The NMOS transistor M4 is diode-connected, and has its gate/drain (anode terminal) connected to the gate of the NMOS transistor M3 and has its source (cathode terminal) connected to the source of the PMOS transistor M5. The gate and drain of the PMOS transistor M5 are connected, respectively, to the input node 212 and the low supply node 204, just like the PMOS transistor 204. The current source 402, which generates a current $I_{BIAS}$, is connected between the high supply node 202 and the anode terminal of the diode-connected NMOS transistor M4.

In operation, the NMOS transistor M3 acts as a floating current source for source follower devices M1, M2. The NMOS transistors M3, M4 form a pseudo current mirror, such that the quiescent current in the transistors M1, M2, M3 is made substantially equal to the input current $I_{BIAS}$ from the current source 402 scaled by the ratio of the sizes of the NMOS transistors M3 and M4. The PMOS transistor M5 may be properly scaled with respect to the PMOS transistor M2 such that the voltages at their sources are identical.

In some embodiments, the current biasing element 206 may additionally or alternatively comprise one or more devices configured to have a voltage or current controlled resistance, such as a device operating in its triode region. In such embodiments, the resistance $R_{BIAS}$ introduced by such an element may be selectively adjusted based upon the desired operating parameters. Additionally or alternatively, one or more components of the current biasing element 206 may be selectively activated, i.e., switched, and may, for example, be controlled by a periodic switch control signal.

The input nodes 208, 212 of the various circuit described herein may be coupled to any of numerous types of signal sources (not shown), and the invention is not limited to use with any particular type of signal source. In some embodiments, for instance, when the circuit is to be used as a reference buffer, the input nodes 208, 212 may be coupled to one or more direct current (DC) signal sources. In other embodiments, one or more of the input nodes 208, 212 may be coupled to a signal source that produces a signal that changes as a function of time. In some embodiments, a control circuit (not shown in FIGS. 2-4) may be coupled to one or more signal sources and may be configured and arranged to control such signal sources so as to independently adjust the signals provided on the input nodes 208, 212.

The output nodes 210, 214 of the various circuits discussed herein may be coupled to and used to drive any of numerous types of loads, and the invention is not limited to use with any particular type of load. In some embodiments, the circuit may, for example, operate as a reference buffer, and the loads to which the output nodes 210, 214 are connected may be inputs of one or more switched-capacitor circuits (not shown) configured and arranged such that the clocked operation of switches causes charge to be selectively transferred from the output nodes 210, 214 to respective capacitors, or vice versa. Examples of switched-capacitor circuits of this sort are described, for example, in U.S. Pat. Nos. 5,323,158; 5,479,130; and 6,040,793, the entire contents of which are incorporated herein by reference.

As noted above, it is not necessary that the particular types of buffers and current biasing elements described above be employed in order to practice certain embodiments of the invention. While disposing a current biasing element 206 between complementary buffers (e.g., NMOS and PMOS source followers) is one way in which two or more buffers may be stacked so as to share the same bias current, many other implementations are also possible. Several possible alternative implementations will now be described with reference to FIG. 5.

Figure 5:
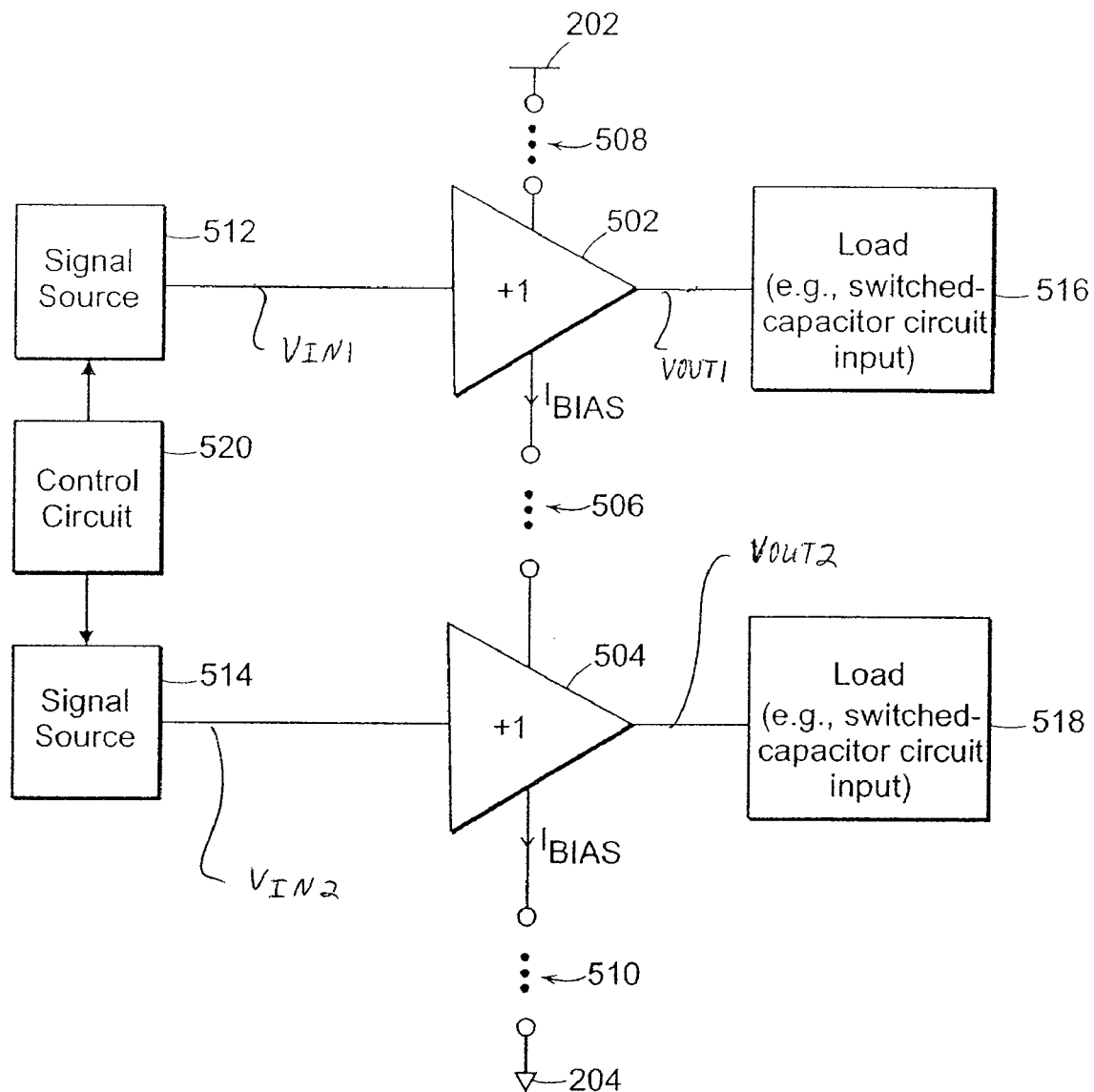
FIG. 5 is a block diagram of another example of a stacked buffer circuit embodying certain aspects of the invention.

As shown in FIG. 5, in some embodiments, a circuit may comprise two or more buffers 502, 504 (which may be of any suitable type or configuration) that are stacked between a high supply node 202 (for example, $V_{DD}$) and a low supply node 204 (for example, GND) in such a way that a quiescent current $I_{BIAS}$ that flows through and biases one of the buffers 502 also flows through and biases another buffer 504. Although only two buffers are shown in the illustrated example, it should be appreciated that any number of additional buffers could also be stacked between the high supply node 202 and the low supply node 204, along with the two buffers 502, 504.

The current $I_{BIAS}$ that is shared by the two or more buffers 502, 504 can be established in any of numerous ways, and the invention is not limited to any particular circuit or technique for doing so. As discussed in connection with the above examples, one way to achieve such a result is to introduce a current biasing element 206 between the buffers, e.g., at the location 506 in FIG. 5. Generation of the bias current $I_{BIAS}$ in such a way might make sense, for example, when two or more complementary transistors are employed as the buffers 502, 504, such as in the examples of FIGS. 2-4 discussed above. In other embodiments, suitable current biasing elements 206 may additionally or alternatively be disposed, for example, at either or both of the locations 508, 510. For instance, if both of the buffers 502, 504 are NMOS source followers, then it might make sense to dispose a current biasing element 206 at the location 510, and to not dispose any components at the locations 506, 508. Likewise, if both of the buffers 502, 504 are PMOS source followers, then it might make sense to dispose a current biasing element 206 at the location 508, and to not dispose any components at the locations 506, 510.

In some embodiments, moreover, suitable current biasing elements may be disposed at more than one, or perhaps even all, of the locations 506, 508, 510. In other embodiments, the circuit may not employ any current biasing elements and may instead rely on one or more of the loads 516, 518 driven by the buffers 502, 504 to establish the level of the bias current $I_{BIAS}$. The ellipses at the locations 506, 508, 510 in FIG. 5 are thus intended to illustrate the possible locations of one or more current bias elements 206, additional buffers, other circuit elements, or perhaps simply direct connections between the illustrated circuit nodes. The particular number, types, and locations of the current biasing elements or other components that are employed can be selected depending on the particular types of buffers that are employed and the particular environment in which such buffers are to be used.

In addition to the aspects discussed above, FIG. 5 illustrates how different signals sources 512, 514 may be used to drive respective ones of the buffers 502, 504, and how different loads 516, 518 may be driven by those buffers 502, 504. As noted above, in some embodiments, for instance, when one or more of the buffers 502, 504 are to be used as reference buffers, one or more of the signal sources 512, 514 may comprise direct current (DC) signal sources. In other embodiments, one or more of the signal sources 512, 514 may be configured to produce a signal that changes as a function of time. As also discussed above, a control circuit 520 may additionally be coupled to one or more of the signal sources 512, 514, and may be configured and arranged to control such signal sources so as to independently adjust the signals provided to the inputs of the buffers 502, 504.

In some embodiments, outputs of one or more of the buffers 502, 504 may be fed back to the control circuit 520, thus allowing the control circuit 520 to control the signal sources 512, 514 so that one or more of the buffers 502, 504 more precisely track a reference signal. For example, one or both of the signal sources 512 may comprise an output of an operational amplifier (not shown) having a differential input and a single-ended output, and the control circuit 520 may comprise the operational amplifier itself. By feeding the output of a buffer 502, 504 back to the inverting input of such an operational amplifier, and providing a reference voltage on the amplifier's non-inverting input, the amplifier will control the signal provided to the input of the buffer so that the voltage at the output of the buffer is exactly the same as the reference voltage. In embodiments in which there is an inherent voltage difference between the input and output of a buffer 502, 502, for example, when a buffer 502, 504 comprises a source follower having a particular gate-to-source voltage drop (e.g., like in the embodiments of FIGS. 2-4), such an implementation can allow a reference voltage provided to the non-inverting input of the operational amplifier to be buffered without introducing such a voltage difference to the load.

As with the other examples discussed above, the loads 516, 518 shown in FIG. 5 may comprise any of a number of devices or circuits, and the invention is not limited to use with any particular type of load. In some embodiments, the buffers 502, 504 may, for example, operate as reference buffers, and the loads 516, 518 that are driven by the buffers 502, 504 may comprise one or more switched-capacitor circuits (not shown) configured and arranged such that the clocked operation of switches causes charge to be selectively transferred from the outputs of the buffers 502, 504 to respective capacitors, or vice versa. Examples of switched-capacitor circuits of this sort are described, for example, in U.S. Pat. Nos. 5,323, 158; 5,479,130; and 6,040,793, the entire contents of which are incorporated herein by reference.

Having described several embodiments of the invention in detail, various modifications and improvements will readily occur to those skilled in the art. Such modifications and improvements are intended to be within the spirit and scope of the invention. Accordingly, the foregoing description is by way of example only, and is not intended as limiting. The invention is limited only as defined by the following claims and the equivalents thereto.

What is claimed is:

1. A circuit, comprising:
    a first buffer having a first input coupled to a first signal source and a first output coupled to a first load, the first buffer configured to provide an output signal substantially tracking an output signal of the first signal source, the first buffer comprising at least one first transistor comprising a first terminal, a second terminal, and a third terminal;
    a second buffer having a second input coupled to a second signal source and a second output coupled to a second load that is distinct from the first load, the second buffer configured to provide an output signal substantially tracking an output signal of the second signal source, the second buffer comprising at least one second transistor comprising a first terminal, a second terminal, and a third terminal,
    wherein the first and second buffers are stacked buffers, and are configured such that a quiescent current that flows from the second terminal of the at least one first transistor to the third terminal of the at least one first transistor also flows from the second terminal of the at least one second transistor to the third terminal of the at least one second transistor; and
    an active current source connected between the first output and the second output as a biasing element that determines a value of the quiescent current, and wherein a current through the active current source is independent of an output voltage of the first buffer and an output voltage of the second buffer.

2. The circuit of claim 1, wherein at least one of the first and second buffers comprises a source follower.

3. The circuit of claim 2, wherein each of the first and second buffers comprises a source follower.

4. The circuit of claim 1, wherein the biasing element comprises a transconductance element configured and arranged such that the quiescent current flows therethrough.

5. The circuit of claim 4, wherein the transconductance element comprises a current-regulating transistor arranged such that the quiescent current flows between its current electrodes.

6. The circuit of claim 5, wherein the biasing element further comprises a diode device, and a current source coupled to both an anode of the diode device and a control electrode of the current-regulating transistor to provide an input current thereto.

7. The circuit of claim 6, further comprising a dummy buffer having an output coupled to a cathode of the diode device, and an input coupled to the input of the second buffer.

8. The circuit of claim 1, wherein the first and second loads comprise inputs to at least one switched-capacitor circuit configured and arranged such that clocked operation of switches causes respective capacitors to be selectively connected to the first and second outputs of the first and second buffers.

9. The circuit of claim 1, further comprising a control circuit configured and arranged to independently adjust the output signals of the first and second signal sources.

10. The circuit of claim 1, wherein the first and second signal sources are configured to provide DC signals to the first and second inputs.

11. The circuit of claim 1, wherein the first and second signal sources are configured to provide signals that change as a function of time to the first and second inputs.

12. A method of operation of a circuit comprising a first buffer comprising at least one first transistor comprising a first terminal, a second terminal, and a third terminal, and a second buffer comprising at least one second transistor comprising a first terminal, a second terminal, and a third terminal, the method comprising steps of:

(a) using an active current source to bias the first and second buffers, wherein the active current source is connected between the first and second buffers such that a current flowing through the first buffer is substantially equal to a current flowing through the second buffer, which is equal to a current flowing through the active current source, and wherein the current flowing through the active current source is independent of an output voltage of the first buffer and an output voltage of the second buffer;

(b) receiving respective input signals at inputs of the first and second buffers; and (c) providing buffered output signals from outputs of the first and second buffers to respective loads that are distinct from the active current biasing element, the buffered output signals substantially tracking the respective input signals.

13. The method of claim 12, wherein at least one of the first and second buffers comprises a source follower.

14. The method of claim 13, wherein each of the first and second buffers comprises a source follower.

15. The method of claim 12, wherein the step (a) comprises regulating the quiescent current with a current-regulating transistor coupled to at least one of the first and second buffers such that the quiescent current flows between its current electrodes.

16. The method of claim 15, wherein the step (a) further comprises a step of causing the current-regulating transistor to regulate the quiescent current so that the quiescent current substantially mirrors a current generated by a current source.

17. The method of claim 12, further comprising a step of providing the buffered output signals from the outputs of the first and second buffers to inputs of at least one switched-capacitor circuit configured and arranged such that clocked operation of switches causes respective capacitors to be selectively connected to the outputs of the first and second buffers.

18. A circuit, comprising:
a first buffer having a first input coupled to a first signal source and a first output coupled to a first load, the first buffer configured to provide an output signal substantially tracking an output signal of the first signal source, the first buffer comprising at least one first transistor comprising a first terminal, a second terminal, and a third terminal;
a second buffer having a second input coupled to a second signal source and a second output coupled to a second load that is distinct from the first load, the second buffer configured to provide an output signal substantially tracking an output signal of the second signal source, the second buffer comprising at least one second transistor comprising a first terminal, a second terminal, and a third terminal; and
active means, distinct from each of the first and second loads, for determining a value of a quiescent current that flows through and biases both the first buffer and the second buffer, the quiescent current flowing from the second terminal of the at least one first transistor to the third terminal of the at least one first transistor and from the second terminal of the at least one second transistor to the third terminal of the at least one second transistor, wherein the active means is an active current source connected between the first output and the second output as a biasing element, and wherein the active current source is independent of an output voltage of the first buffer and an output voltage of the second buffer.

19. The circuit of claim 1, wherein each of the first and second loads has an impedance that changes substantially during operation thereof.

20. The method of claim 12, wherein each of the respective loads of the first and second buffers has an impedance that changes substantially during operation thereof 21. The circuit of claim 18, wherein each of the first and second loads has an impedance that changes substantially during operation thereof.

22. The circuit of claim 18, wherein a current flowing through the biasing element is substantially equal to a current flowing through the first buffer and substantially equal to a current flowing through the second buffer.

23. The circuit of claim 1, wherein the biasing element includes a first element with a first terminal, a second terminal, and a third terminal, stacked between the first buffer and the second buffer such that the second terminal of the first element is connected to the first buffer and the third terminal of the first element is connected to the second buffer, the first element being further connected via the first terminal to a second element with a first terminal, a second terminal, and a third terminal, wherein the second element is further connected to an active current source, such that the first element and the second element form a pseudo current mirror, such that a quiescent current in the first buffer, the second buffer, and the first element is substantially equal to a current generated by the active current source but scaled by a ratio of sizes between the first element and the second element.

24. The circuit of claim 1, wherein a current flowing through the biasing element is substantially equal to a current flowing through the first buffer and substantially equal to a current flowing through the second buffer.

* * * * *